US012068228B2

(12) United States Patent
Lee

(10) Patent No.: US 12,068,228 B2
(45) Date of Patent: Aug. 20, 2024

(54) LEADLESS SEMICONDUCTOR PACKAGE WITH SHIELDED DIE-TO-PAD CONTACTS

(71) Applicant: NXP USA, Inc., Austin, TX (US)

(72) Inventor: Pat Lee, Kaohsiung (TW)

(73) Assignee: NXP USA, Inc., Austin, TX (US)

( * ) Notice: Subject to any disclaimer, the term of this patent is extended or adjusted under 35 U.S.C. 154(b) by 267 days.

(21) Appl. No.: 17/551,366

(22) Filed: Dec. 15, 2021

(65) Prior Publication Data

US 2023/0187321 A1    Jun. 15, 2023

(51) Int. Cl.
*H01L 23/495*  (2006.01)
*H01L 21/48*   (2006.01)
*H01L 23/00*   (2006.01)
*H01L 23/31*   (2006.01)
*H01L 23/498*  (2006.01)

(52) U.S. Cl.
CPC ...... *H01L 23/4952* (2013.01); *H01L 21/4821* (2013.01); *H01L 21/486* (2013.01); *H01L 23/3114* (2013.01); *H01L 23/49827* (2013.01); *H01L 24/16* (2013.01)

(58) Field of Classification Search
CPC ............... H01L 23/3114; H01L 23/495; H01L 23/4952; H01L 23/49827
USPC ....................................................... 257/697
See application file for complete search history.

(56) References Cited

U.S. PATENT DOCUMENTS

| | | | | |
|---|---|---|---|---|
| 4,642,889 A * | 2/1987 | Grabbe | ............... | H05K 3/3436 |
| | | | | 361/767 |
| 4,705,205 A * | 11/1987 | Allen | ..................... | B23K 3/06 |
| | | | | 439/70 |
| 4,955,523 A * | 9/1990 | Carlommagno | ........ | H01L 24/11 |
| | | | | 228/175 |
| 5,481,436 A * | 1/1996 | Werther | ................. | H05K 1/141 |
| | | | | 439/75 |
| 5,656,863 A * | 8/1997 | Yasunaga | .............. | H01L 21/565 |
| | | | | 257/E23.021 |
| 5,923,084 A * | 7/1999 | Inoue | .................. | H01L 23/3121 |
| | | | | 257/E23.125 |
| 6,031,281 A * | 2/2000 | Kang | ..................... | H01L 21/56 |
| | | | | 257/784 |
| 6,648,211 B2 * | 11/2003 | Saiki | ........................ | B23K 1/20 |
| | | | | 228/180.1 |
| 6,727,579 B1 * | 4/2004 | Eldridge | ................. | H01L 24/72 |
| | | | | 257/E23.024 |

(Continued)

*Primary Examiner* — Nitin Parekh

(57) ABSTRACT

A leadless semiconductor package includes a conductive base having a plurality of apertures formed around a perimeter of the conductive base and extending from a first surface to an opposing second surface of the conductive base. The semiconductor package further includes an IC die having a third surface facing the first surface of the conductive base and having a plurality of conductive pillars disposed thereon. Each conductive pillar extends from the third surface to the first surface via a corresponding aperture. A dielectric fill material is disposed in the apertures and insulates the conductive pillars from the conductive material of the conductive base. An opening of an aperture at the second surface, the bottom end of the conductive pillar disposed therein, and the dielectric fill material at the opening of the aperture at the second surface together form a surface mount pad for mounting the semiconductor package to a corresponding pad of a circuit board.

12 Claims, 5 Drawing Sheets

(56) References Cited

U.S. PATENT DOCUMENTS

| | | | |
|---|---|---|---|
| 8,969,132 B2* | 3/2015 | Sherrer | C23C 28/42 |
| | | | 438/106 |
| 2001/0009301 A1* | 7/2001 | Azuma | H01L 23/49548 |
| | | | 257/E21.508 |
| 2006/0125113 A1 | 6/2006 | Liu et al. | |
| 2020/0006571 A1 | 1/2020 | Hayashi et al. | |
| 2021/0398882 A1* | 12/2021 | Thompson | H01L 21/56 |

* cited by examiner

LEADLESS SEMICONDUCTOR PACKAGE WITH SHIELDED DIE-TO-PAD CONTACTS

BACKGROUND

Flat no-leads packages, such as quad-flat no-leads packages (QFPs) and dual-flat no-leads (DFN) packages, are surface mount (SMT) semiconductor packages that encapsulate one or more integrated circuit (IC) die and provide electrical connections between the IC die and a printed circuit board (PCB) or other circuit board via a metal leadframe that forms conductive pads (or lands) at the perimeter of the package. When employing a flip chip approach, the IC die such packages typically are connected to fingers of the leadframe via conductive bumps or pillars. During manufacturing, leadframes are interconnected into a two-dimensional array via tie bars that connect adjacent leadframes. However, due to floorplan dimensions, routing issues, and radio frequency (RF) interference concerns, the lengths of the leadframe fingers and tie bars often are considerably limited due to the risk of warpage during the solder reflow process that results in long finger non-coplanarity. This results in difficulty in designing and manufacturing flat no-lead packages at high yields.

SUMMARY OF EMBODIMENTS

In one aspect, a leadless semiconductor package includes a conductive base having a plurality of apertures extending from a first surface to an opposing second surface of the conductive base, the second surface serving as a mounting surface of the leadless semiconductor package. The leadless semiconductor package further includes an integrated circuit (IC) die having a third surface facing the first surface of the conductive base and having a plurality of conductive pillars, each conductive pillar extending from the third surface to the first surface via a corresponding aperture of the plurality of apertures. The leadless semiconductor package also includes a dielectric fill material disposed in the plurality of apertures and insulating the conductive pillars from the conductive base.

Implementations of the leadless semiconductor package may include one or more of the following features individually or in a combination of features. An opening of an aperture at the second surface, an end of a conductive pillar in the aperture at the second surface, and the dielectric fill material disposed between the end of the conductive pillar and the opening of the aperture together form a surface mount pad of the leadless semiconductor package. The dielectric fill material is further disposed between the third surface and the first surface. The third surface is an active surface of the IC die and the conductive pillars of the plurality of conductive pillars are formed at corresponding die pads at the third surface. An encapsulant material encapsulating the IC die. The conductive base are composed of one or more materials selected from a group consisting of: copper or a copper alloy. The conductive pillars are composed of one or more materials selected from a group consisting of: copper or a copper alloy. The dielectric fill material comprises a pre-impregnated composite material. The IC die is configured to transmit or receive signaling via one or more conductive pillars of the plurality of conductive pillars at one or more radio frequencies and the dielectric fill material is configured to suppress transmission of signals at the one or more radio frequencies.

In accordance with another aspect, an electronic device includes a circuit board having the leadless semiconductor package described above mounted thereon.

In accordance with yet another aspect, a method of fabricating a leadless semiconductor package includes forming a plurality of first holes of a workpiece, each first hole extending from a first surface toward an opposing second surface of a conductive base layer and terminating prior to the second surface. The method further includes forming a dielectric fill layer at the first surface of the conductive base layer with dielectric fill material of the dielectric fill layer filling the plurality of first holes and forming a plurality of second holes, each second hole extending from a third surface of the dielectric fill layer opposite the first surface to proximate to a bottom of a corresponding first hole of the plurality of first holes. The method additionally includes disposing an IC die proximate to the third surface such that each conductive pillar of a plurality of conductive pillars of the IC die extends into a corresponding second hole of the plurality of second holes and removing material of the conductive base layer at the second surface so as to expose the plurality of first holes and the dielectric fill material and the plurality of conductive pillars contained therein at a fourth surface of a resulting conductive base of the workpiece.

Implementations of the leadless semiconductor package may include one or more of the following features individually or in a combination of features. Encapsulating the IC die in an encapsulant material. Singulating the workpiece after encapsulating the IC die to provide the leadless semiconductor package. After removing material of the conductive base layer, openings of the plurality of first holes at the fourth surface, ends of the conductive pillars at the fourth surface, and the dielectric fill material at the openings of the plurality of first holes at the fourth surface together form surface mount pads for the leadless semiconductor package. Mounting the leadless semiconductor package to a circuit board of an electronic device. The IC die configured to transmit or receive signaling via one or more conductive pillars of the plurality of conductive pillars at one or more radio frequencies and the method further including selecting a dielectric fill material that is to suppress transmission of signals at the one or more radio frequencies as the dielectric fill material to be used in forming the dielectric fill layer. The dielectric fill material comprises a pre-impregnated composite material. One or both of the plurality of conductive pillars or the conductive base layer is composed of one or more materials selected from a group consisting of: copper or a copper alloy. Forming the plurality of first holes in the conductive base layer includes etching the conductive base layer to form the plurality of first holes and forming the plurality of second holes comprises laser drilling the dielectric fill layer to form the second holes.

In accordance with yet another aspect, a leadless semiconductor package is formed in accordance with the above-described method.

BRIEF DESCRIPTION OF THE DRAWINGS

The present disclosure is better understood, and its numerous features and advantages made apparent to those skilled in the art, by referencing the accompanying drawings. The use of the same reference symbols in different drawings indicates similar or identical items.

DETAILED DESCRIPTION

Figure 1:
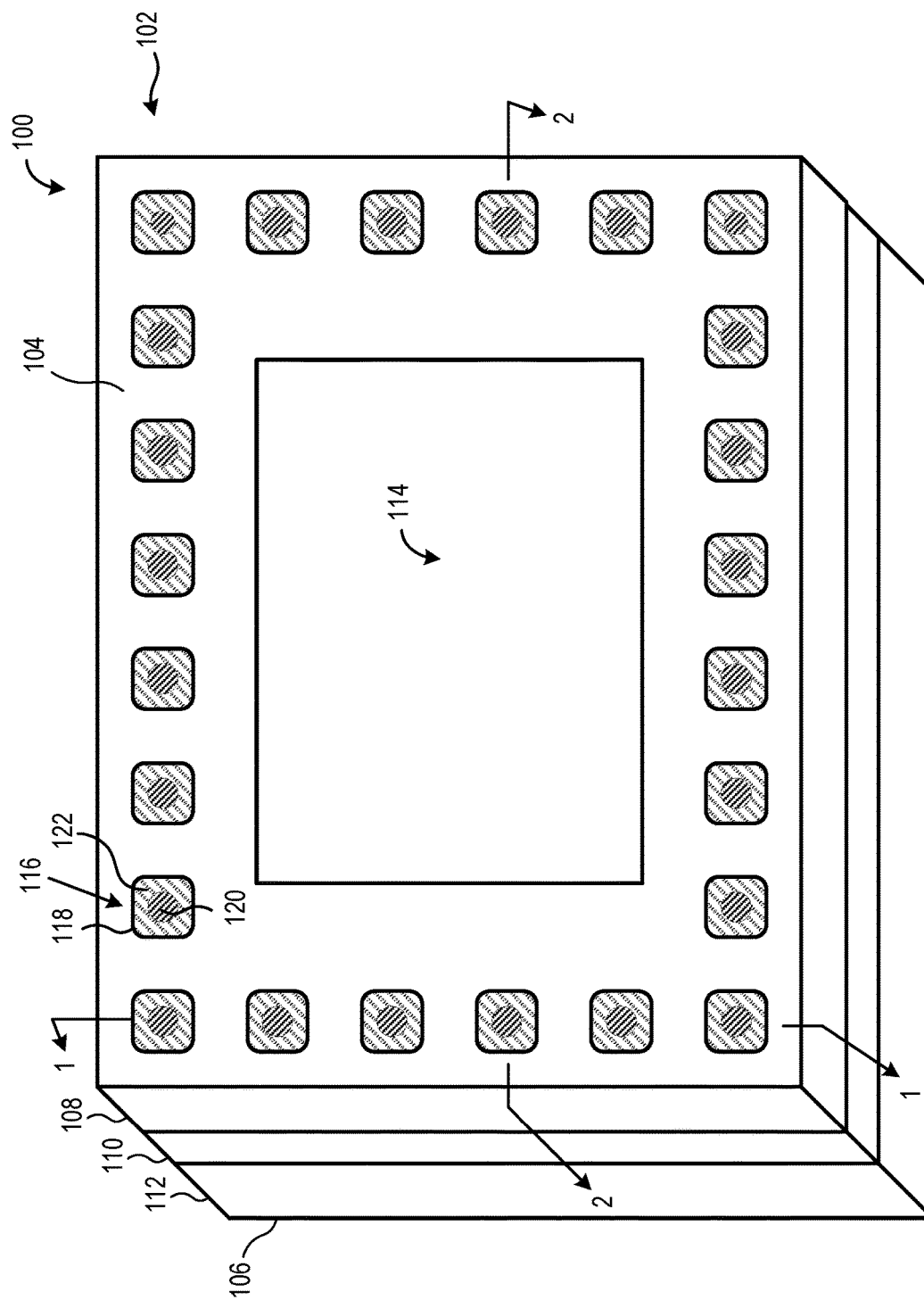
FIG. 1 is a diagram illustrating a bottom perspective view of a leadless semiconductor package having shielded die-to-pad contacts in accordance with some embodiments.

Conventional QFP, DFN, and other flat no-lead semiconductor package configurations often require extensive design and manufacturing efforts in order to meet leadframe finger length and tie bar length limitations. Moreover, in radio frequency (RF) applications, it can be difficult to adequately shield the conductive path between an RF signal pad on the IC die and the corresponding mounting pad of the package due to the presence of the fingers and other structures in the leadframes of conventional flat, no-lead packages. FIGS. 1-5 below illustrate embodiments of a leadless semiconductor package having shielded IC die-to-surface mount pad (hereinafter, "die-to-pad") contacts that mitigate some or all of the finger length, tie bar length, and RF interference issues, as well as methods for manufacture of such packages. Rather than employing leadframe fingers to provide a conductive path between the bumps of an IC die and the corresponding surface mount pad of the package containing the IC die, in at least one embodiment the semiconductor packages described herein employ a leadframe-like conductive base (e.g., a slab or similar block structure) with a set of apertures, each aperture extending from a first surface of the conductive base to an opposing second surface, with the second surface being the mounting surface of the package. The set of apertures may be distributed along a perimeter of the conductive base, or otherwise distributed across the opposing first and second surfaces. Conductive pillars of an IC die extend into the apertures such that each conductive pillar terminates at the second surface. Dielectric fill material fills each aperture and electrically isolates the sidewall of each aperture from the conductive pillar disposed in the aperture. The opening of each aperture at the second surface, which exposes the end of the corresponding conductive pillar, thus may serve as a surface mount pad for the package. Accordingly, the package can be mounted to a PCB or other circuit board using, for example, a solder reflow process in which solder is disposed at each aperture opening and then reflowed to mechanically connect the package to the circuit board and to electrically connect the conductive pillar exposed at the aperture opening to a corresponding circuit board pad (or landing).

As the conductive base is composed of a conductive material (e.g., copper (Cu) or a copper alloy) and as each conductive pillar of the IC die is positioned such that it extends through a corresponding aperture of the conductive base, each conductive pillar is separated from adjacent conductive pillars by interposing conductive material of the conductive base, which results in each conductive pillar being at least partially shielded from electromagnetic (EM) interference from the other conductive pillars of the IC die via the conductive material of the conductive base surrounding each aperture, particularly when the corresponding conductive pillar is used to conduct RF signaling to or from the IC die. Further, in some embodiments a dielectric fill that operates to suppress one or more radio frequencies employed in the RF signaling is utilized in the dielectric fill layer of the package so as to provide further RF shielding.

Note that in the following, certain positional terms, such as top, bottom, and the like, are used in a relative sense to describe the positional relationship of various components. These terms are used with reference to the relative position of components either as shown in the corresponding figure or as used by convention in the art and are not intended to be interpreted in an absolute sense with reference to a field of gravity. Thus, for example, a surface shown in the drawing and referred to as a top surface of a component would still be properly understood as being the top surface of the component, even if, in implementation, the component was placed in an inverted position with respect to the position shown in the corresponding figure and described in this disclosure. Moreover, it will be appreciated that for simplicity and clarity of illustration, components shown in the figures have not necessarily been drawn to scale. For example, the dimensions of some of the components may be exaggerated relative to other components.

Figure 2:
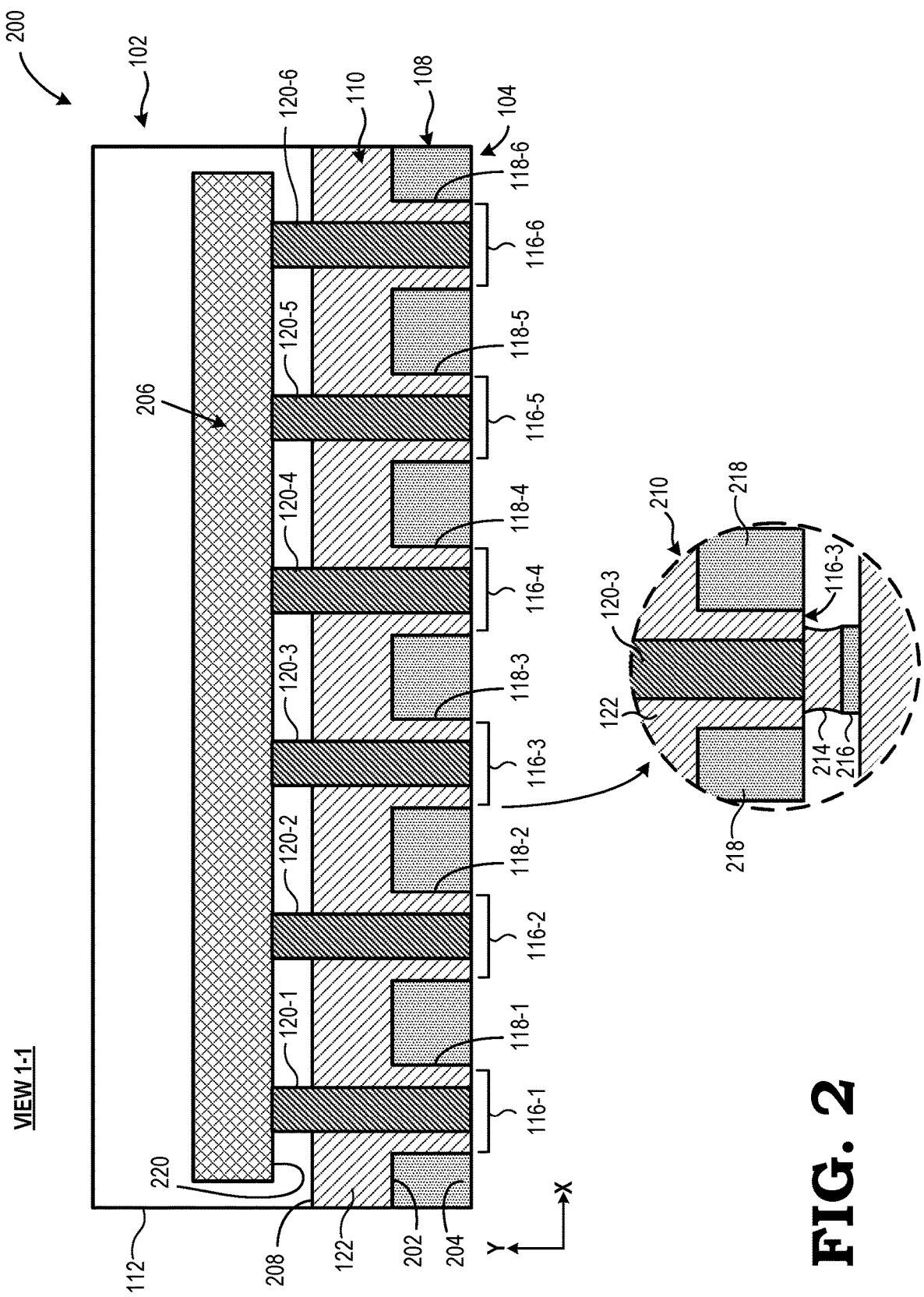
FIG. 2 is a diagram illustrating a cross-section view of the leadless semiconductor package of FIG. 1 in accordance with some embodiments.
Figure 3:
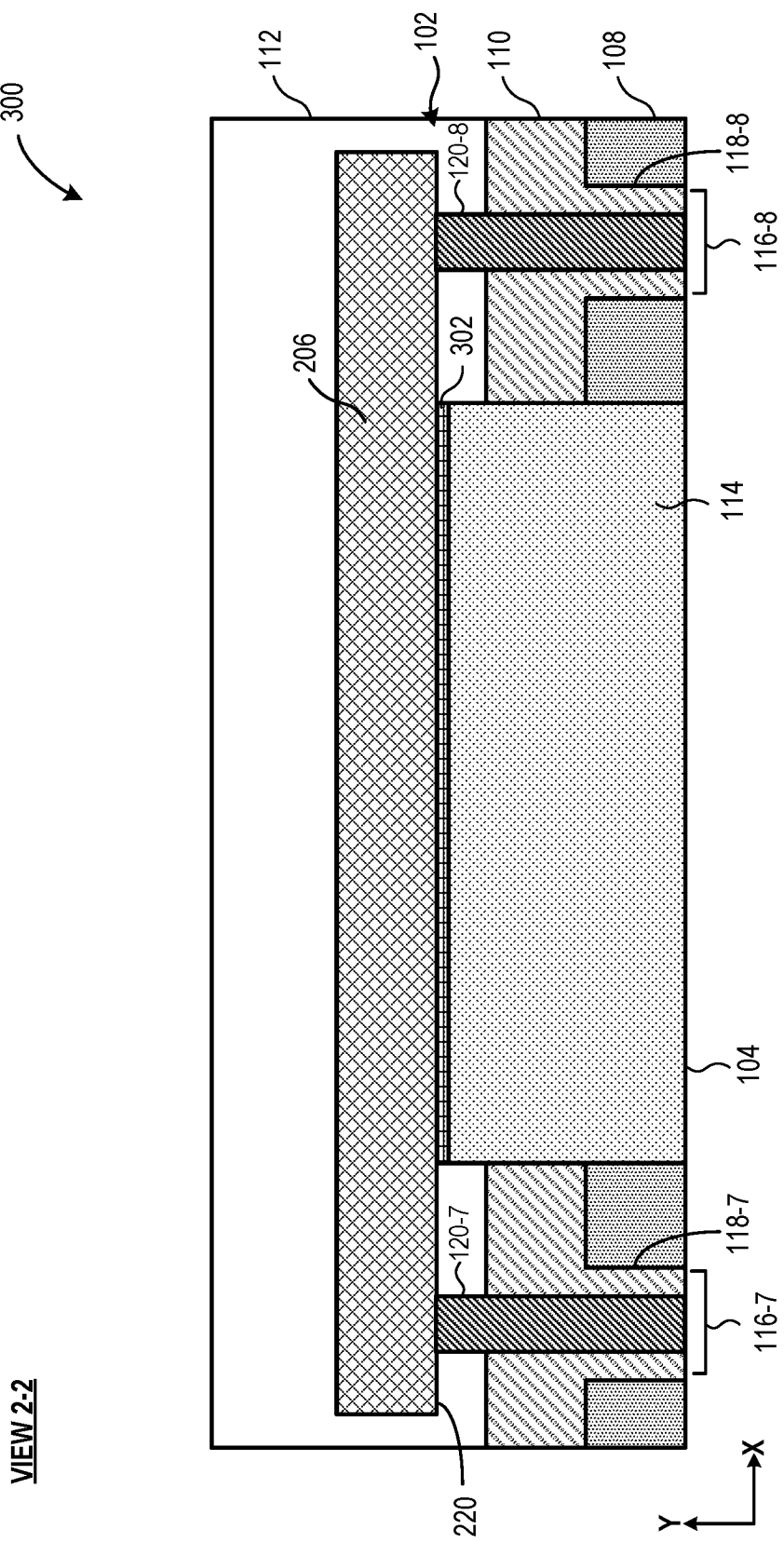
FIG. 3 is a diagram illustrating another cross-section view of the leadless semiconductor package of FIG. 1 in accordance with some embodiments.

FIGS. 1-3 together illustrate a bottom perspective view 100 (FIG. 1), a cross-section view 200 (FIG. 2) along cut line 1-1, and a cross-section view 300 (FIG. 3) along cutline 2-2 of a leadless semiconductor package 102 (hereinafter, "package 102") employing shielded die-to-pad connections in accordance with some embodiments. The package 102 encapsulates one or more IC die (not shown in FIG. 1) and is configured to surface mount to a PCB or other circuit board of an electronic device (not shown). In particular, the package 102 implements a flat, no-lead package configuration in which the surface mount pads (or "leads") are implemented on the periphery or elsewhere on a bottom surface of the package.

As shown in FIG. 1, the package 102 has a bottom surface 104 and an opposing top surface 106, with the bottom surface 104 serving as the mounting surface by which the package 102 is mounted to a PCB or other circuit board of an electronic device (not shown). In the depicted embodiment, the package 102 is composed of a stack of structures/layers, including a leadframe-like conductive base 108, a dielectric fill layer 110, and an encapsulant layer 112. The package 102 further can include a die attach paddle 114 that extends from the bottom surface 104 to facing surface of one or more IC die of the package via aligned apertures in the conductive base 108, die fill layer 110, and encapsulant layer 112. The die attach paddle 114 is composed of thermally conductive and/or electrically conductive material (e.g., copper, aluminum, or an alloy thereof) and serves as one or both of a thermal conduit for extracting heat from the IC die of the package 102 or a ground connection for the IC die of the package 102.

The conductive base 108 is a slab, layer, or other block-type structure composed of conductive material, such as one or more metals or metal alloys, such as copper (Cu), aluminum (Al), a copper alloy, an aluminum alloy, an iron (Fe)-nickel (Ni) alloy (e.g., Alloy 42), and the like. As is typical with leadframes in flat packages, the conductive base 108 serves both as a mounting structure for mounting one or more IC die (see FIGS. 2 and 3) as well as a structure for providing rigidity to the package 102 for manufacturing, handling, and mounting of the package 102. However, unlike conventional leadframes, in at least some embodiments the conductive base 108 does not serve to provide conductive pathways between the one or more encapsulated IC die of the package 102 and the bottom surface of the package 102, but rather serves as a shielding structure for conductive pathways between the IC die(s) and the bottom surface 104 formed via separate pillar structures. Thus, as depicted by view 100, the bottom surface 104 implements a plurality of surface mount pads 116 disposed at the periphery of the bottom surface. In other embodiments, some or all of the surface mount pads 116 may be disposed elsewhere besides the periphery, such as evenly distributed across the bottom surface, distributed in a particular pattern, and the like. Each surface mount pad 116 is formed by an opening at bottom surface 104 of a corresponding aperture 118 of a plurality of apertures 118 formed along the periphery of the conductive base 108. Each aperture 118 extends through the conductive base 108 and contains a corresponding conductive pillar 120 of a plurality of conductive pillars 120 that are electrically and mechanically connected to corresponding pads of an IC die of the package 102. Each aperture 118 further contains dielectric fill material 122 of the dielectric fill layer 110 that serves both to maintain the conductive pillar 120 in a relatively fixed position relative to the aperture 118 and to electrically isolate the conductive pillar 120 from the sidewalls of the aperture 118.

In this approach, the bottom end of the conductive pillar 120 is disposed at the bottom surface 104 and accessible via the corresponding aperture 118 in the conductive material of the conductive base 108, while being electrically isolated from the conductive material of the conductive base 108 via the dielectric fill material 122 disposed between the conductive pillar 120 and the sidewalls of the aperture 118. As such, the conductive material of the conductive base 108 between the apertures 118 of the package can serve as RF shielding for proximate conductive pillars 120 and thus serving to mitigate RF interference between adjacent or proximate conductive pillars 120. Moreover, as described below, in RF implementations the particular material selected for use as the dielectric fill material 122 can be selected for its ability to suppress radio frequencies corresponding to one or more RF signals being conducted via the conductive pillar 120 so as to provide additional RF shielding.

With the bottom opening of each aperture 118 forming a corresponding surface mount pad 116 together with the bottom end of the conductive pillar 120 disposed therein and the dielectric fill material 122 separating the aperture 118 and the conductive pillar 120, the package 102 can be mounted to a PCB or other circuit board of an electronic device via a solder reflow process in which solder balls/bumps are disposed between the surface mount pads 116 of the package 102 and the corresponding board pads of the circuit board and then the solder reflowed so as to provide a mechanical and electrical connection between the bottom ends of the conductive pillars 120 and the corresponding board pads, and thus providing conductive pathways between the IC die of the package 102 and the board pads via the conductive pillars 120, with RF shielding provided by the conductive material of the conductive base 108 between the apertures 118.

FIG. 2 depicts a cross-section view 200 of the package 102 along cut line 1-1 that illustrates this configuration in greater detail. As shown, the conductive base 108 is composed of a conductive material (e.g., copper or a copper alloy) extending between a top surface 202 and an opposing bottom surface 204, with the bottom surface 204 forming at least a portion of the bottom surface 104 of the package 102. In the example of FIGS. 1-3, the package 102 has a 6×8 pad configuration, and thus six apertures 118, denoted apertures 118-1 to 118-6, are formed in the conductive base 108 along cut line 1-1, with each of apertures 118-1 to 118-6 extending from the top surface 202 to the bottom surface 204. In this example, the package 102 includes a single IC die 206 having a plurality of conductive pillars 120 disposed at the perimeter of the IC die 206 in a corresponding 6×8 pillar configuration, and thus six conductive pillars 120, denoted conductive pillars 120-1 to 120-6, are shown along cut line 1-1 in the cross-section view 200. The top end of each conductive pillar 120 is electrically and mechanically connected to a corresponding die pad of the IC die 206. In this example, the IC die 206 is in a flip chip configuration, and thus the die pads and the conductive pillars 120 are formed on the active side of the IC die 206 in which transistors and other IC circuitry of the IC die 206 are formed. In other embodiments, the conductive pillars 120 can be formed on the inactive side of the IC die 206 and connected to the active side of the IC die 206 via various conductive structures, such as vias, through-silicon vias (TSVs), metal traces, and the like. The conductive pillars 120 can be composed of a metal or metal alloy, such as copper or a copper alloy, or combinations of metals and metal alloys, and in some implementations may be plated or otherwise coated with another conductive material, such as a gold (Au) or silver (Ag) plating.

As shown, the IC die 206 is positioned relative to the conductive base 108 so that each conductive pillar 120 extends into a corresponding aperture 118 such that a bottom end of the conductive pillar 120 terminates at an opening of the corresponding aperture 118 at the bottom surface 204 of the conductive base 108; that is, the bottom end of the conductive pillar is "flush" with the bottom surface 204. Thus, conductive pillars 120-1 to 120-6 extend through apertures 118-1 to 118-6, respectively, to the bottom surface 204 of the conductive base 108. Note that although an example implementation in which a single IC die is encapsulated in the package 102 is illustrated, the present disclosure is not limited to such implementations and instead may provide for a semiconductor package that encapsulates multiple IC die, with each IC die having a plurality of conductive pillars that are positioned within a corresponding subset of the peripheral apertures 118 of the conductive base 108.

The dielectric fill layer 110 comprises the dielectric material 122 that covers some or all of the top surface 202 of the conductive base 108 and extends to a top surface 208 of the layer 110. Further the dielectric material 122 fills the voids of the apertures 118 not occupied by the conductive pillars 120 so as to physically and electrically separate the conductive pillars 120 from the sidewalls of the apertures 118 in the conductive material of the conductive base 108, as well as to mechanically fix the positions of the conductive pillars 120 within the apertures 118. The dielectric fill material 122 can include any of a plurality of dielectric materials or combinations thereof. To illustrate, in some embodiments, the dielectric fill material 122 includes a pre-impregnated ("prepreg") composite material, such as a fiberglass impregnated with epoxy or resin (e.g., bismaleimide triazine (BT) resin).

In some implementations, the IC die 206 participates in RF signaling via one or more of the conductive pillars 120, by either or both of transmitting RF signals to the circuit board 212 via one or more conductive pillars 120 or receiving RF signals from the circuit board 212 via one or more conductive pillars 120. As explained above, as at least part of the length of each conductive pillar 120 is RF shielded from adjacent conductive pillars 120 by the conductive material of the conductive base 108 that surrounds at least a portion of the lengths of the conductive pillars 120. To provide additional RF shielding, a dielectric material that has certain properties that suppress electromagnetic (EM) transmission at some or all of the radio frequencies of such signals can be selected for use as the dielectric fill material 122 used for the dielectric fill layer 110. The dielectric fill material 122 selected in this manner thus can supplement the RF shielding provided by the sidewalls of the apertures 118, as well as provide further RF shielding between the portions of the conductive pillars 120 that extend above the apertures 118 within the dielectric fill layer 110 that is above the top surface 202 of the conductive base 108.

With the IC die 206 positioned such that the conductive pillars 120-1 to 120-6 extend to the bottom surface 204 via corresponding apertures 118-1 to 118-6, respectively, and with the volumes of the apertures 118-1 to 118-6 not occupied by the conductive pillars 120-1 to 120-6 filled with dielectric fill material 122, the resulting dielectric-and-conductive-pillar-filled openings of the apertures 118-1 to 118-6 at the bottom surface 204 form surface mount pads 116-1 to 116-6, respectively. As shown by expanded view 210 of a portion of the package 102 containing the surface mount pad 116-3, the package 102 can be surface mounted to a circuit board 212 via a solder connection 214 formed between the surface mount pad 116-3 and a corresponding board pad 216 via reflow of a solder bump disposed between the surface mount pad 116-3 and the board pad 216, such that the solder connection 214 forms a physical and electrical connection between the conductive pillar 120-3 and the board pad 216 while avoiding physical and electrical contact with the conductive material 218 of the conductive base 108 surrounding the conductive pillar 120-3 and co-disposed dielectric fill material 122.

As further illustrated, the encapsulating layer 112 comprises a layer of encapsulating material (e.g., plastics, epoxy molding compounds (EPCs), ceramics, etc.) that encapsulates the IC die 206. In the illustrated example, the IC die 206 and the conductive pillars 120 are configured such that a bottom surface 220 of the IC die 206 is offset from the top surface 208 of the dielectric fill layer 110 and thus encapsulating material is formed in the region between the facing surfaces 208 and 220. In other embodiments, the IC die 206 and conductive pillars 120 are configured such that the bottom surface 220 of the IC die 206 is in contact with the top surface 208 of the dielectric fill layer 110.

FIG. 3 illustrates a different cross-section view 300 of the package 102 along cut line 2-2 in accordance with some embodiments. As shown, apertures 118-7 and 118-8 are formed in the conductive base 108 to receive conductive pillars 120-7 and 120-8, respectively, formed on the IC die 206, along with dielectric fill material 122 of the dielectric fill layer 110 so as to form die pads 116-7 and 116-8, respectively. The conductive base 108, dielectric fill layer 110, and encapsulant layer 112 also have aligned apertures formed therein so as to receive the die attach paddle 114 such that the die attach paddle 114 extends from the bottom surface 104 of the package 102 to proximate to the bottom surface 220 of the IC die 206. A thermally-conductive and/or electrically-conductive adhesive or other fill material 302 can be disposed between the die attach paddle 114 and the IC die 206 so as to provide mechanical, electrical, and/or thermal connections between the die attach paddle 114 and the IC die 206.

Figure 4:
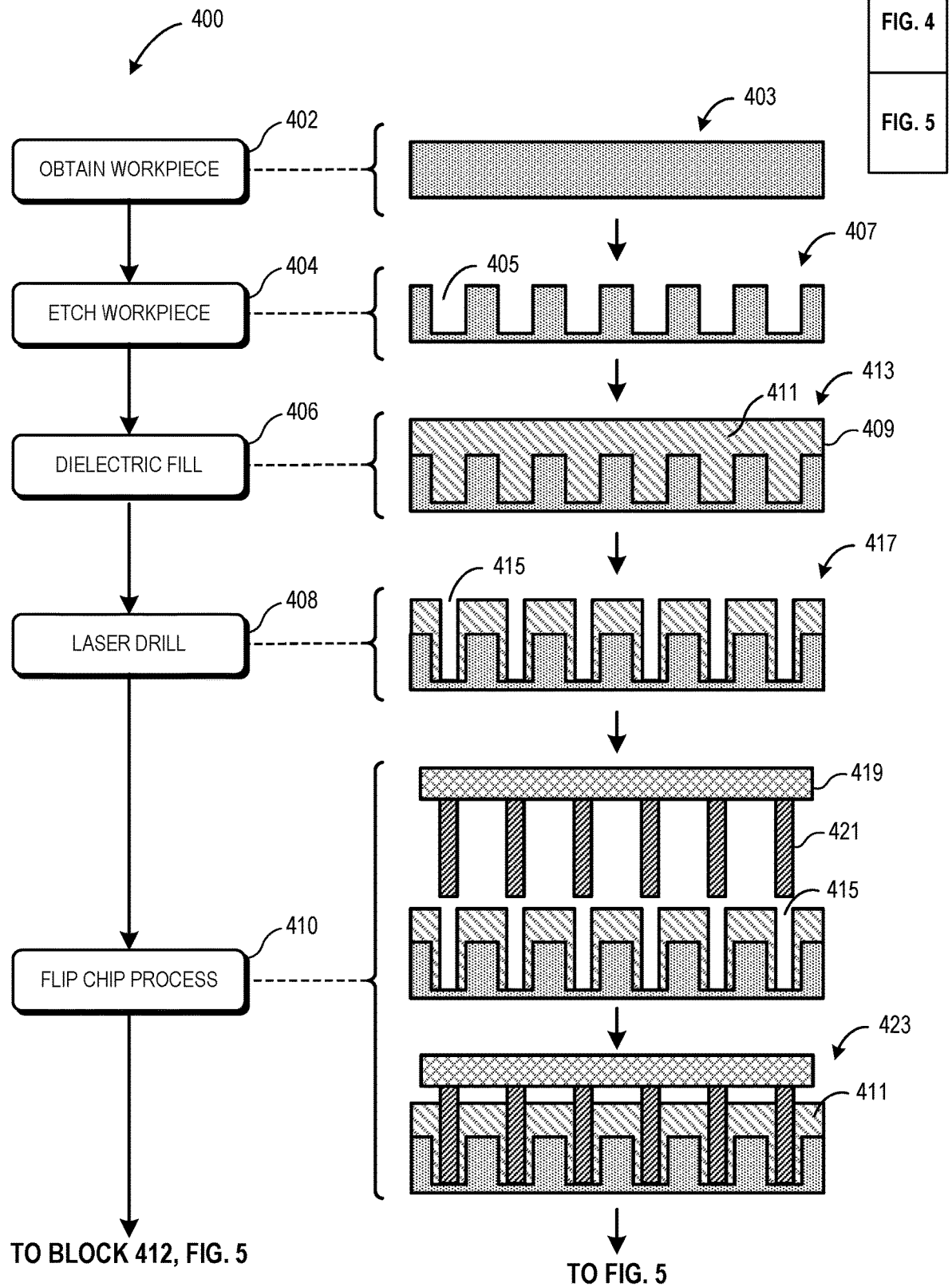
FIGS. 4 and 5 are diagrams that together illustrate a method of fabrication of a leadless semiconductor package having shielded die-to-pad contacts in accordance with some embodiments.
Figure 5:
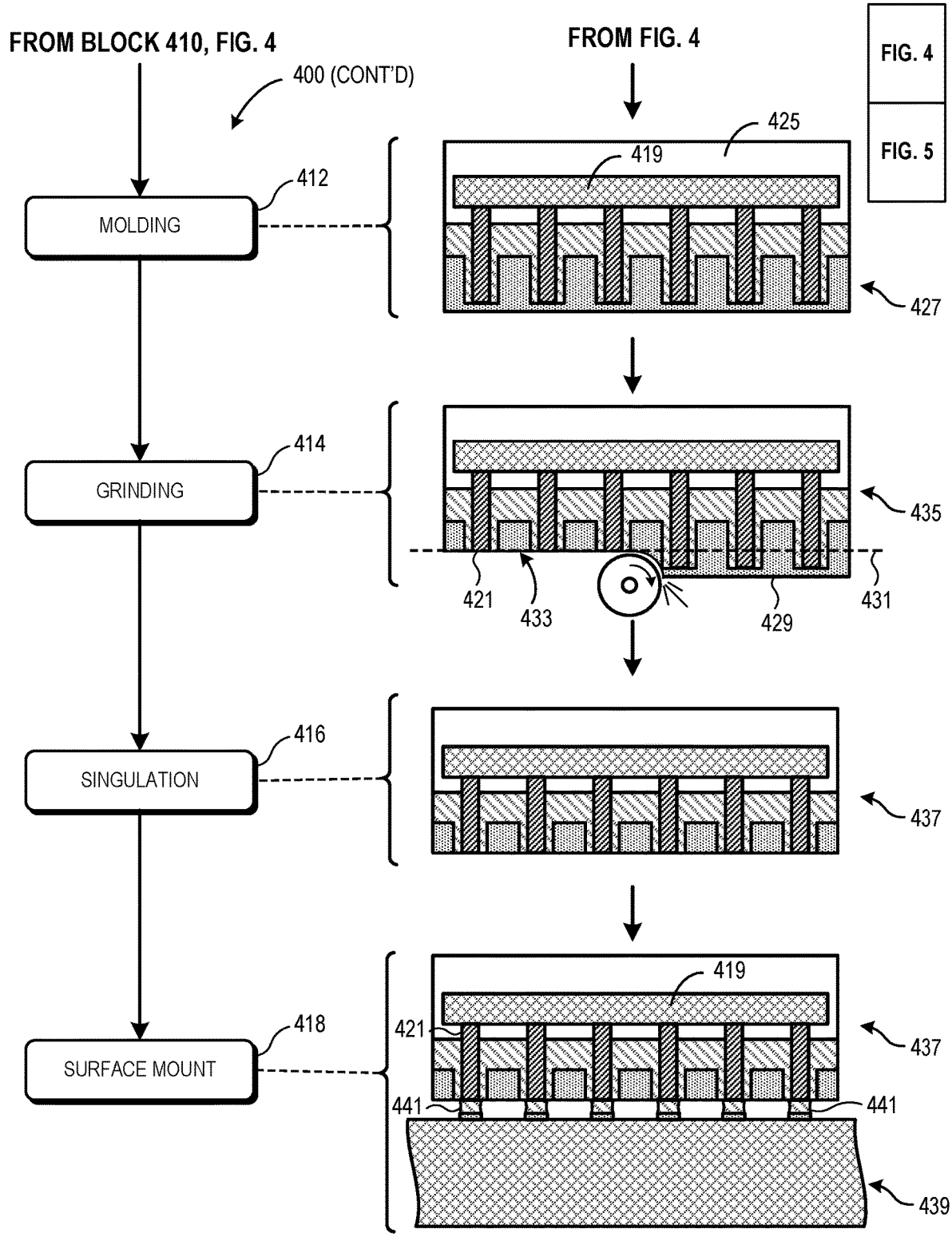

FIGS. 4 and 5 together illustrate a method 400 of fabrication of a leadless semiconductor package having shielded die-to-pad contacts in accordance with some embodiments. For ease of illustration, the method 400 is described with reference to the package 102 of FIGS. 1-3, but the method 400 is not limited to this example description.

The method 400 initiates at block 402 with the fabrication or other obtainment of a workpiece 403 representing a leadframe-like conductive base layer (that is a layer of conductive material). It will be appreciated that the workpiece 403 typically is one workpiece in a M×N array of workpieces (M, N>=1) being concurrently processed as a set, but is illustrated as a separate, single workpiece for ease of illustration and description. In at least one embodiment, the workpiece 403 is provided as a conductive base layer in the form of a rectangular block of metal or metal alloy, such as copper or a copper alloy, with a thickness that is greater than a thickness of the resulting conductive base 108 so as to facilitate backside grinding, as described below.

At block 404, the workpiece 403 is subjected to an etching process to form a plurality of first holes 405 along a perimeter of the conductive base layer, resulting in a modified workpiece 407. As shown, the first holes 405 extend from a top surface of the modified workpiece 407 but stop short of a bottom surface of the modified workpiece 407 so as to provide containment for dielectric fill material disposes therein. The perimeters of the first holes 405 can be implemented in any of a variety of shapes, including circular or elliptical, rectangular, and the like.

At block 406, a dielectric fill layer 409 (e.g., dielectric fill layer 110) is formed on the modified workpiece 407 by depositing a dielectric fill material 411 (e.g., dielectric fill material 122) on the modified workpiece 407 such that the plurality of first holes 405 are filled with the dielectric fill material 411, thereby forming a workpiece 413. For example, the dielectric fill material 411 can comprise an uncured (or not fully cured) prepreg material disposed at the top surface of the modified workpiece 407 so as to fill the first holes 405 and form a layer on top.

At block 408, a laser drill process is performed on the workpiece 413 so as to form a plurality of second holes 415 in a resulting workpiece 417, each second hole 415 is substantially coaxial with a corresponding first hole 405 and extending through the dielectric fill layer 409 to a location at, or proximate to, the bottom of the corresponding first hole 405. The diameter of each second hole 415 is configured to be compatible with the diameter of the conductive pillars 120 so as to be able to receive a corresponding pillar 120 without requiring excessive seating force; that is, the diameter of the second holes 415 is equal to, or slightly larger than, a diameter of the conductive pillars to be positioned into the second holes 415.

At block 410, a flip chip process is performed in which one or more IC dies 419 (e.g., IC die 206) are obtained, each of the one or more IC dies 419 having a set of conductive pillars 421 (e.g., conductive pillars 120) formed at a surface of the IC die 419. In the illustrated example, the conductive pillars 421 are formed at corresponding pads on the active surface of the IC die 419, whereas in other embodiments the conductive pillars 421 are formed on the inactive surface of the IC die 419 and then connected to the circuitry of the IC die using vias, TSVs, and the like. The conductive pillars 421 of the IC die 419 are dimensioned and positioned such that when the IC die 419 is joined with the workpiece 417, the conductive pillars 421 of the IC die 419 align with corresponding second holes 415 of the workpiece 417 and are inserted so as to occupy the corresponding second holes 415 during the joining process, resulting in a workpiece 423. As noted above, in some embodiments the dielectric fill material 411 was not fully cured up to this point, and thus the dielectric fill material 411 may function as an adhesive to affix the IC die 419 and conductive pillars 421 to the workpiece 417, and the resulting workpiece 423 then subjected to a curing process so as to fully cure the dielectric fill material 411. Alternatively, the subsequent molding or solder reflow processes (described herein) could also serve as the curing process for the dielectric fill material 411.

Turning to FIG. 5, the method 400 continues at block 412 with a molding process to mold the one or more IC die 419 and the workpiece 423 in an encapsulant material 425 (e.g., plastic or ECM) to form a workpiece 427.

At block 414, the workpiece 427 is subject to a backside grinding process or other ablative process to remove material at a bottom side 429 of the workpiece 427 up to a grinding line 431 that is set above the bottom of the first holes 405 so as to expose the first holes 405 (as apertures, such as apertures 118), the conductive pillars 421, and the dielectric fill material 411 separating the conductive pillars 421 from the sidewalls of the first holes 405 at a bottom surface 433 of a workpiece 435 resulting from the grinding process.

At block 416, the workpiece 435 is subjected to a singulation process so as to separate the workpiece 435 from the other workpieces of the M×N array of workpieces, resulting in a leadless semiconductor package 437 (e.g., package 102). Any of a variety of singulation processes can be employed, including punch singulation, blade singulation, and the like.

At block 418, the leadless semiconductor package 437 is surface mounted to a circuit board 439 via a solder reflow process so as to form solder joints 441 that electrically and mechanically connect the conductive pillars 421 to corresponding pads of the circuit board 439 so that electrical signaling can be conducted between the one or more IC die 419 of the semiconductor package 437 and the circuit board 439 via the conductive pillars 421 with EM shielding provided by the conductive base material that surround the conductive pillars 421 with the dielectric fill material 411 disposed therebetween.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A leadless semiconductor package comprising:
   a conductive base having a plurality of apertures extending from a first surface to an opposing second surface of the conductive base, the second surface serving as a mounting surface of the leadless semiconductor package;
   an integrated circuit (IC) die having a third surface facing the first surface of the conductive base and having a plurality of conductive pillars, each conductive pillar extending from the third surface to the first surface via a corresponding aperture of the plurality of apertures;
   a dielectric fill material disposed in the plurality of apertures and insulating the conductive pillars from the conductive base; and
   a die attach paddle disposed within a perimeter defined by the plurality of apertures and that extends from the second surface toward the third surface via aligned apertures in the conductive base and the dielectric fill material.

2. The leadless semiconductor package of claim 1, wherein an opening of an aperture at the second surface, an end of a conductive pillar in the aperture at the second surface, and the dielectric fill material disposed between the end of the conductive pillar and the opening of the aperture together form a surface mount pad of the leadless semiconductor package.

3. The leadless semiconductor package of claim 1, wherein the dielectric fill material is further disposed between the third surface and the first surface.

4. The leadless semiconductor package of claim 1, wherein:
   the third surface is an active surface of the IC die; and
   the conductive pillars of the plurality of conductive pillars are formed at corresponding die pads at the third surface.

5. The leadless semiconductor package of claim 1, further comprising:
   an encapsulant material encapsulating the IC die.

6. The leadless semiconductor package of claim 5, wherein the die attach paddle disposed within the perimeter comprises disposing the die attach paddle within the perimeter defined by the plurality of apertures via aligned apertures in the conductive base, the dielectric fill material, and the encapsulant material.

7. The leadless semiconductor package of claim 1, wherein the conductive base is composed of one or more materials selected from a group consisting of: copper or a copper alloy.

8. The leadless semiconductor package of claim 1, wherein the conductive pillars are composed of one or more materials selected from a group consisting of: copper or a copper alloy.

9. The leadless semiconductor package of claim 1, wherein the dielectric fill material comprises a pre-impregnated composite material.

10. The leadless semiconductor package of claim 1, wherein:
    the IC die is configured to transmit or receive signaling via one or more conductive pillars of the plurality of conductive pillars at one or more radio frequencies; and
    the dielectric fill material is configured to suppress transmission of signals at the one or more radio frequencies.

11. An electronic device comprising a circuit board having the leadless semiconductor package of claim 1 mounted thereon.

12. The leadless semiconductor package of claim 1, wherein a fill material is disposed between the die attach paddle and the IC die.

* * * * *